United States Patent [19]

Heuwieser et al.

[11] Patent Number: 4,694,207
[45] Date of Patent: Sep. 15, 1987

[54] FET GATING CIRCUIT FOR SWITCHING ELECTRICAL LOADS

[75] Inventors: Erwin Heuwieser, Haar; Kurt Schwaiger, Wolfratshausen, both of Fed. Rep. of Germany

[73] Assignee: Siemens Aktiengesellschaft, Berlin and Munich, Fed. Rep. of Germany

[21] Appl. No.: 827,653

[22] Filed: Feb. 7, 1986

Related U.S. Application Data

[63] Continuation of Ser. No. 473,869, Mar. 10, 1983, abandoned.

[30] Foreign Application Priority Data

Mar. 12, 1982 [DE] Fed. Rep. of Germany ....... 3209070

[51] Int. Cl.⁴ .................... H03K 17/687; H03K 17/56
[52] U.S. Cl. .................................... 307/571; 307/242; 307/575; 307/296 R
[58] Field of Search ............... 307/570, 571, 576, 575, 307/577, 296 R, 304, 240–244

[56] References Cited

U.S. PATENT DOCUMENTS 4,048,632  5/1977  Spence ........................... 307/296 A
4,052,623  10/1977  Loberg ................................ 307/571
4,461,966  7/1984  Hebenstreit .......................... 307/571

Primary Examiner—Stanley D. Miller
Assistant Examiner—B. P. Davis
Attorney, Agent, or Firm—Herbert L. Lerner; Laurence A. Greenberg

[57] ABSTRACT

Method of switching electrical loads having one side thereof at reference potential and being connected in d-c networks with n-channel MOS switching transistors includes applying a control voltage which is at least equal to a sum of voltages of a respective d-c network plus a voltage of the gate-source path of a respective switching transistor to a gate of the respective switching transistor; and device for performing the method.

3 Claims, 3 Drawing Figures

FET GATING CIRCUIT FOR SWITCHING ELECTRICAL LOADS

This application is a continuation of application Ser. No. 473,869, filed Mar. 10, 1983, now abandoned.

The invention relates to a method and a circuit arrangement for switching electrical loads having one side thereof at reference potential and being connected in d-c networks with n-channel MOS switching transistors.

In such circuits, the switching transistor must connect the full d-c voltage of the d-c network minus the voltage drop ($I_{Load} \times R_{DSON}$) to the consumer, $R_{DSON}$ being the resistance on the drain-source path in the conducting state. Furthermore, the required control voltage at the gate-source path must not decrease the voltage at the consumer.

Especially in applications to vehicles, where d-c networks with relatively low voltage are available, the terminal voltage at the battery being further lowered, for example, at winter temperatures, there is a danger that the foregoing requirements may not be met.

While circuits are known for correcting these difficulties, in which the switching transistor is fully driven by a voltage transformer (with potential separation) between the gate-source path, these circuits are relatively expensive.

It is therefore an object of the invention to describe a method and a circuit arrangement of the type mentioned at the outset, in which these difficulties are corrected by relatively simple means.

With the foregoing and other objects in view, there is provided, in accordance with the invention, a method of switching electrical loads having one side thereof at reference potential and being connected in d-c networks with n-channel MOS switching transistors which comprises applying a control voltage which is at least equal to a sum of voltages of a respective d-c network plus a voltage of the gate-source path of a respective switching transistor to a gate of the respective switching transistor.

In accordance with another mode of the invention, the method includes addressing the respective individual loads at intervals offset in time for controlling a plurality of loads in dynamic operation.

In accordance with another aspect of the invention there is provided a circuit arrangement for performing a method of switching electrical loads having one side thereof at reference potential and being connected in d-c networks with n-channel MOS switching transistors comprising a respective one of the switching transistors being provided for each of the loads and having a gate connected to an input transistor.

In accordance with another feature of the invention there is provided
a diode connected between and to the switching transistor and the input transistor.

Practical further embodiments of the invention are given in the subclaims.

Other features which are considered as characteristic for the invention are set forth in the appended claims.

Although the invention is illustrated and described herein as embodied in a method and circuit arrangement for switching electrical loads, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
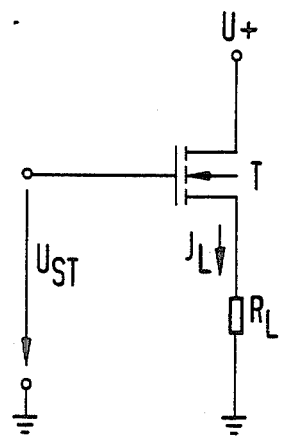
FIG. 1 is a basic circuit diagram for the circuit arrangement for switching electrical loads in accordance with the invention.

Referring now to the drawing and, first, particularly to FIG. 1 thereof, there is shown a basic circuit diagram wherein a consumer, an electrical load $R_L$, is connected to a d-c voltage source $U_+$ by means of an MOS switching transistor T. One side of the consumer $R_L$ is connected to ground. A control voltage $U_{ST}$, the value of which is equal to or greater than the sum of the voltages of the d-c network $U_+$ plus the voltage $U_{GS}$ of the gate-source path of the switching transistor T, is applied to the control terminal (gate) of the switching transistor T. The magnitude of the control voltage $U_{ST}$ depends upon the current $I_L$ through the consumer $R_L$, the relationship being such that with higher current values $I_L$, a higher control voltage $U_{ST}$ also is required for switching the transistor T into conduction. Applying the control voltage $U_{ST}$ has the advantage that the full voltage U of the d-c network can be connected to the consumer $R_L$ without any increase in the voltage loss at the switching transistor T due to the control voltage.

Figure 2:
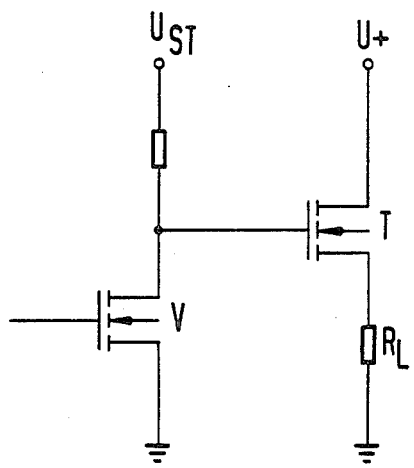
FIG. 2 is a further basic circuit diagram of another embodiment of the circuit arrangement.

In FIG. 2, an embodiment of the invention is shown, wherein the control voltage $U_{ST}$, which is to be applied to the control electrode of the switching transistor T, may be connected-through almost without power by means of an input transistor V. With this input stage V, the advantage is achieved that, especially for low logic voltages (for example, TTL), the required control voltage $U_{ST}$ is available in the d-c network at the switching transistor T.

The voltage transformer and the load circuit operate at the same potential, the switching transistor T being drivable statically or dynamically.

Figure 3:
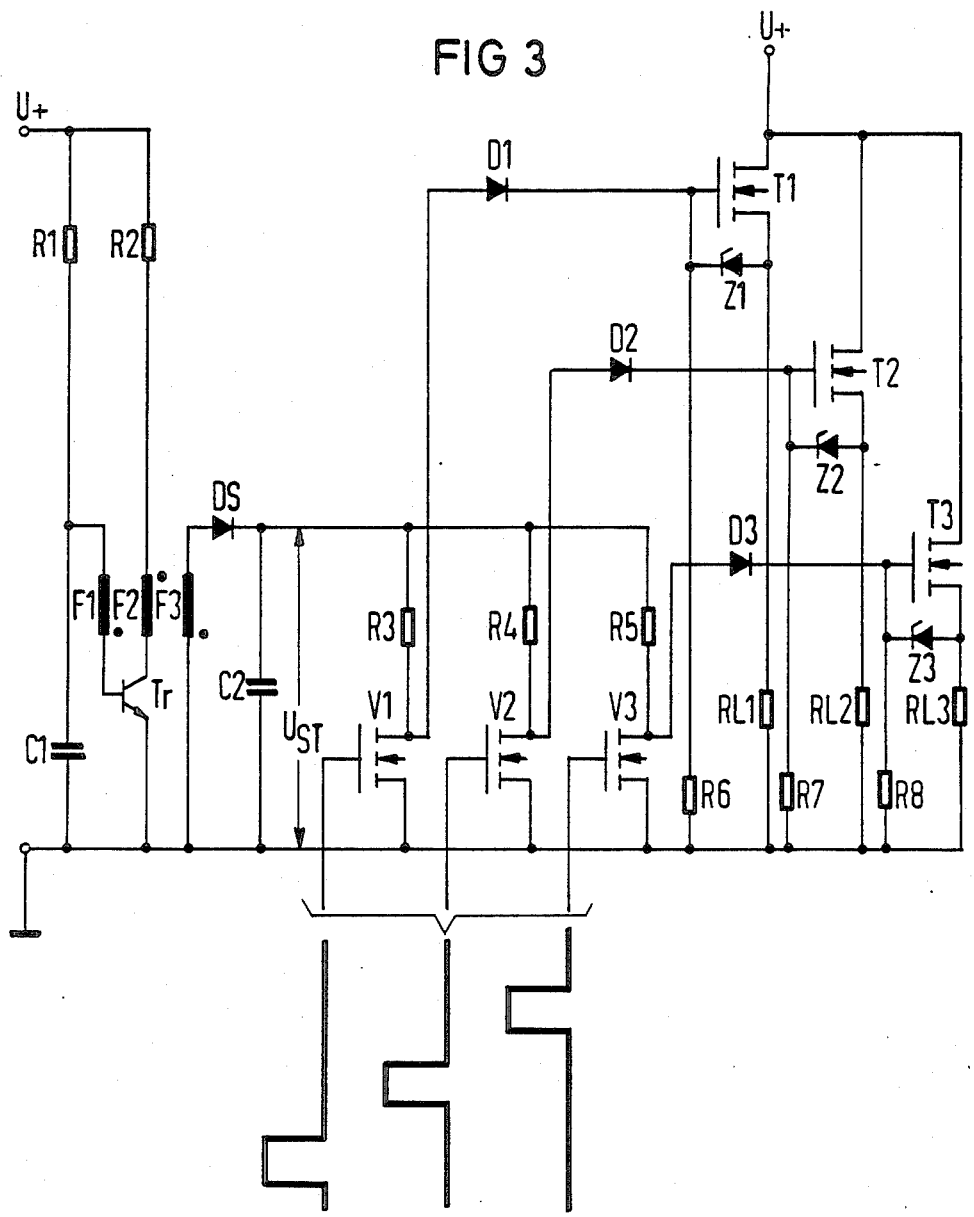
FIG. 3 is a more detailed circuit diagram of a circuit arrangement according to the invention, with several consumers.

In the embodiment of the invention shown in FIG. 3, three consumers $R_{L1}$, $R_{L2}$ and $R_{L3}$ are connected to the d-c network by means of three switching transistors T1, T2 and T3. Control is effected by means of a control voltage $U_{ST}$ which is supplied by an oscillator circuit formed by a ferrite core with windings F1, F2, F3, a capacitor C1, resistors R1 and R2 and a transistor Tr. This oscillator circuit generates, by means of voltage transformation, a voltage which is higher than the voltage $U_+$ of the d-c network. The control voltage $U_{ST}$ is applied, as shown in FIG. 3, via resistors R3, R4 and R5 to input transistors V1, V2 and V3. As is shown diagrammatically in FIG. 3, a pulse is applied sequentially, for example, by means of a microprocessor control, to the gates of the input transistors V1 to V3, all of the gates of the switching transistors T1 to T3 being charged sequentially. Diodes D1, D2 and D3 prevent the gate-source capacity of the switching transistors T1 to T3 from discharging. Zener diodes Z1, Z2 and Z3 and resistors R6, R7 and R8 are arranged for the protection of the switching transistors T1 to T3.

The embodiment shown in FIG. 3 thus operates dynamically, the addressing of the consumers being offset timewise. The control voltage source is thereby loaded lightly, and the control voltage source, for example, need be designed or constructed only so as to be adequate for addressing a single consumer.

The control voltage source may therefore be used also for more than the number of consumers shown in FIG. 3 if a switching transistor and an input transistor are provided for each consumer, so that, in addition to the advantage previously mentioned hereinbefore, namely, that the full voltage of the d-c network may be applied to one consumer. A further advantage of the circuit arrangement according to the invention is that the control voltage source need be constructed or designed only for addressing one consumer while there are actually n consumers.

The foregoing is a description corresponding to German Application No. P 32 09 070.6, dated Mar. 12, 1982, the International priority of which is being claimed for the instant application, and which is hereby made part of this application. Any discrepancies between the foregoing specification and the aforementioned corresponding German application are to be resolved in favor of the latter.

We claim:

1. Circuit arrangement for switching an electrical load, comprising an MOS switching transistor having its drain-source path connected between the positive terminal of a d-c voltage source and one side of the load, the other side of the load being connected to ground potential, said switching transistor having a gate to which a control voltage is applied which is at least equal to the sum of the voltage of said d-c voltage source and a voltage of a gate-source path of said switching transistor, an oscillator circuit for generating said control voltage by voltage transformation, said oscillator circuit being connected in parallel with said series connection of the load and said switching transistor between said positive and negative terminals of said d-c voltage source, and an input transistor for switching said switching transistor, said input transistor having a drain-source path connecting said gate of said switching transistor and said negative terminal of said d-c voltage source, said input transistor having a gate for receiving switching pulses.

2. Circuit arrangement according to claim 1, wherein said oscillator circuit is formed of a ferrite core with three windings, a capacitor, first and second resistors and a transistor, the first resistor being connected at one end with the positive terminal of the d-c source and at the other end in series with one side of the capacitor, the other side of the capacitor being connected to ground potential, one end of the first winding being connected to a point connecting said other end of the first resistor and said one side of the capacitor, the other end of the first winding being connected to a base of the transistor, the second resistor being connected at one end with the positive terminal of the d-c source and at the other end with one end of the second winding, the other end of the second winding being connected through a collector-emitter path of the transistor to ground potential, one end of the third winding being connected with ground potential, another capacitor being connected at one side to the other end of the third winding via a rectifier diode, said other capacitor having its other side connected to ground potential, said control voltage ($U_{ST}$) being obtainable across said other capacitor.

3. Circuit arrangement according to claim 1, wherein the electrical load is formed of a plurality of individual loads, a respective switching transistor and a respective input transistor being provided for each of said individual loads.

* * * * *